United States Patent
Ito et al.

(10) Patent No.: US 6,536,031 B2
(45) Date of Patent: Mar. 18, 2003

(54) METHOD FOR GENERATING BEHAVIOR MODEL DESCRIPTION OF CIRCUIT AND APPARATUS FOR LOGIC VERIFICATION

(75) Inventors: Masaki Ito, Machida (JP); Yoshio Takamine, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/906,756

(22) Filed: Jul. 18, 2001

(65) Prior Publication Data

US 2002/0046391 A1 Apr. 18, 2002

(30) Foreign Application Priority Data

Aug. 31, 2000 (JP) .................................... 2000-268393

(51) Int. Cl.$^7$ ............................................ G06F 17/50
(52) U.S. Cl. ............................................ 716/18; 716/6
(58) Field of Search ............................ 716/6, 18, 4, 5, 716/17

(56) References Cited

U.S. PATENT DOCUMENTS 5,955,736 A * 9/1999 Robinson et al. ........ 250/458.1
6,074,428 A * 6/2000 Petler ........................ 716/15
6,308,292 B1 * 10/2001 Fusco ........................ 703/22

FOREIGN PATENT DOCUMENTS

JP       2000-123064       10/1998

OTHER PUBLICATIONS

Kei Suzuki, Kouji Ara, and Kazuo Yano, "Owl: An Interface Description Language for IP Reuse," Central Research Laboratory, Hitachi, Ltd, pp. 1–4.

* cited by examiner

Primary Examiner—Tuan T. Lam (57) ABSTRACT

A method for automatically generating a behavior model description of a circuit that is used with a simulator and a logic verification apparatus. An interface description defining the state transition of input/output signals of a logic circuit module at clock cycle accuracy and a functional description defining the processing function of signals or data of the logic circuit module as a program function are read, and a logic behavior model description of a circuit defining in-circuit behavior and a state transition of input/output signal at clock cycle accuracy is automatically generated.

18 Claims, 10 Drawing Sheets

FIG. 2

```
void byte_read (int addr [8], int *value) {
  int i ;
  long int address=0 ;
  extern int memory [MEM_SIZE] [8] ;

for (i=7 ; i>=0 ; i--) {
    address+=(addr [i])<<i) ;
  } for (i=7 ; i>=0 ; i--) {
    *(value+i)=memory [address] [i] ;
  }
}
```

20 define interface simple_memory ;  ···201 define port ;
  input. clock clk ;
  input. control rst_n ;
  input. control rw ;
  input. control en_n ;  ···202
  input. data [7 : 0] addr ;
  input. control wait_n ;
  input. data [7 : 0] d ;
endport define alphabet ;
  signal set= { clk, rst_n, en_n, rw, addr, wait_n, d } ;
  NOP : {posedge, 1, 1, *, *, 1, Z } ;
  RST : {posedge, 0, *, *, *, *, Z } ;  ···203
  RRQ (Xa) : {posedge, 1, 0, 1, $i.Xa, 1, Z } ;
  RWAIT : {posedge, 1, 1, *, *, 0, Z } ;
  ROUT (Xd) : {posedge, 1, 1, *, *, 1, $o.Xd } ;
endalphabet define word ;
  void nop : NOP NOP* ;
  void reset : RST RST* ;  ···204
  data (Xd) byte_read (Xa) : RRQ (Xa) RWAIT RWAIT ROUT (Xd) ;
endword define sentence ;
  reset [ reset | nop | byte_read (Xa)]* ;  ···205
endsentence
endinterface

FIG. 6

```
#define NOP   ((clk==1)&&(rst_n==1)&&(en_n==1)&&(*wait_n==1))
#define RST   ((clk==1)&&(rst_n==0))                                        ...401
#define RRQ   ((clk==1)&&(rst_n==1)&&(en_n==0)&&(rw==1)) ¥
              &&(*wait_n==1))
#define RWAIT ((clk==1)&&(rst_n==1)&&(en_n==1)&&(*wait_n==0))
#define ROUT  ((clk==1)&&(rst_n==1)&&(en_n==1)&&(*wait_n==1))

void simple_memory (
   int clk, int rst_n, int rw, int en_n, int addr[], int *wait_n, int *d    ...402
) {
static long int state=1L, prev_state=0L ;
long int i ;                                                                ...403
static int Xa [8] ;

switch (state) {                                                            ...404
case 1L :
   if (clk==0) {
   } else if (RST) {
      prev_state=state ; state=2L ;                                         ...405-1
   } else fprintf (stderr, "illegal state transition¥n" ) ;
   break ;

case 2L :
   if (clk==0) {
     *wait_n=1 ;
   } else if (RST) {
      prev_state=state ; state=2L ;
   } else if (NOP) {
      prev_state=state ; state=2L ;                                         ...405-2
   } else if (RRQ) {
      for (i=7L ; i>=0L ; i-- ) Xa [i]=addr [i] ;
      prev_state=state ; state=3L ;
   } else fprintf (stderr, "illegal state transition¥n" ) ;
   break ;
```

FIG. 7

```
case 3L :
    if (clk==0) {
        *wait_n=0 ;
    } else if (RWAIT) {
        prev_state=state ; state=4L ;
    } else fprintf (stderr, "illegal state transition\n" ) ;
    break ;
```
...405-3

```
case 4L :
    if (clk==0) {
        *wait_n=0 ;
    } else if (RWAIT) {
        prev_state=state ; state=5L ;
    } else fprintf (stderr, "illegal state transition\n" ) ;
    break ;
```
...405-4

```
case 5L :
    if (clk==0) {
        byte_read (Xa, d) ;
        *wait_n=1 ;
    } else if (ROUT) {
        prev_state=state ; state=2L ;
    } else fprintf (stderr, "illegal state transition\n" ) ;
    break ;
```
...405-5

```
default :
    fprintf (stderr, "illegal state transition\n" ) ;
    break ;
    }
}
```
...406

METHOD FOR GENERATING BEHAVIOR MODEL DESCRIPTION OF CIRCUIT AND APPARATUS FOR LOGIC VERIFICATION

PRIORITY TO FOREIGN APPLICATIONS

This application claims priority to Japanese Patent Application No. P2000-268393.

BACKGROUND OF THE INVENTION

1. Field of the Invention

The present invention relates to a method for generating a behavior model description of a circuit and an apparatus for logic verification, and more particularly relates to a method for generating a behavior model description of a circuit for system level design and verification, and an apparatus for logic verification of a complete system or a part of a logic circuit system.

2. Description of the Background

Heretofore, where logic circuit systems such as a digital synchronous computer and a system LSI are incorporated in a LSI, a design method has been known in which a software programming language such as C and/or C++ language is applied in system level design. The system function is described using these programming languages, is compiled on a computer, and is then executed after linking with a software library. As a result, the functional verification of a logic circuit system by way of the functional simulation may be realized.

However, this design method focuses only on the system function of the logic circuit system, and the method is not capable of describing or verifying the system behavior including the input/output timing of various signals that are to be considered when the logic circuit system is wholly or partially implemented in hardware.

On the other hand, a system design method that realizes the desired function of the entire system by combining the software to be executed on a processor, an existing hardware circuit module, and newly designed hardware (to be verified) to supplement the deficiency of the function has been known. In the following description, a central processing unit is regarded as one of the hardware modules.

In the case of a logic circuit system having a plurality of circuit modules, it is preferably designed so that the interface of each circuit module is acceptable for a signal transmission procedure (referred to as a "protocol") between the various modules.

A technique for describing the interface of the circuit modules so that the input/output timing of various signals may be found is described in, for example, K. Suzuki et al. "OwL: An Interface Description Language for IP Reuse" IEEE CICC, '99, pp. 403–406. A similar technique is disclosed in Japanese Published Unexamined Patent Application No. Hei 12-123064 (Japanese Patent Application No. Hei 10-297827).

In the interface description methodology, a combination of signal values of the input/output signal in the circuit module is represented by an alphabet name, and each interface of the circuit module is defined as a set of alphabet name sequences. Furthermore, the regular expression is used as the method for expressing the sequences and the method for expressing the set to thereby realize various interface expressions with a relatively small amount of description. The interface description methodology disclosed in the Japanese Published Unexamined Patent Application No. Hei 12-123064 is referred to hereinafter as the "OwL interface description methodology."

Heretofore, logic simulation has been used widely to verify the hardware design of a logic circuit system. In logic simulation, the design is described by way of a hardware description language, and the design is executed using a simulator (it is simulated). Where the logic circuit system has a plurality of circuit modules, a new circuit module (newly designed part) to be verified is entered as a detailed description that indicates the design result to the simulator, and an old or known circuit module (a peripheral logic module) that is to be connected to the module under verification is entered as a simplified description to the simulator (to be executed at a high speed). As a result, the entire system may be simulated. The simplified description of the peripheral logic is described, in some cases, by way of a hardware description language and in some cases by way of a software programming language such as C language.

In design verification using a simulator, the behavior of the circuit under verification and the peripheral logic is executed according to a test pattern to obtain output values. The obtained output value and the contents of an internal register or memory are compared with expected values to thereby determine whether the circuit under verification operates correctly (as designed). The "expected values" (predicted outcome) of the circuit under verification may be obtained by previous manual calculation or by using a special program for calculation of the expected value. An expected value calculation program may be connected to a simulator to calculate each expected value when a circuit under verification is executed for simulation. Such an expected value calculation program is described by way of a hardware description language in some cases and by way of a software programming language (such as C or C++) in other cases.

However, in the case of the conventional design method, considerable amounts of time (man-months) are typically required to develop a peripheral logic description and an expected value calculation program of a circuit under verification, which is prepared before the design verification of a piece of hardware. A highly accurate peripheral logic description and expected value calculation program are required because of the high speed and complex logic of the circuit under verification. This complexity requires an extensive amount of time to prepare the verification environment.

A need has been recognized in the art, therefore, to shorten the time requirement of the preparation stage in simulation of the logic circuit system. There also may exist a need to provide a method for generating a behavior model description of a circuit and the software that promptly generates a behavior model description of a circuit including the timing information of various input/output signals.

Further, there has been recognized a need in the art to provide a method for generating a behavior model description of a circuit and the software that promptly generates a highly accurate expected value that is desired for verification of a circuit module. A need has also been identified to provide a logic verification apparatus that can be used to promptly verify the design result of a circuit module. Further, there may exist a need to provide a logic verification apparatus that is capable of prompt verification of the design result of a component circuit module that is combined with one or a plurality of peripheral (e.g., known, old) circuit modules to form one logic system.

SUMMARY OF THE INVENTION

To address one or more of the above-mentioned needs, in at least one aspect of the present invention, a behavior model description of a circuit required by a simulator is automatically generated by use of a system level functional description of a circuit module and an interface description of the circuit module as input.

The present invention preferably provides a method for generating a behavior model of a circuit comprising the steps of: reading an interface description that defines state transition of a group of input/output signals of a circuit module at the clock cycle accuracy (wherein "at the clock cycle accuracy" herein assumes that all necessary signal and/or data lines have reached a steady state value upon a clock edge); reading a functional description that defines the processing functionality of signals or data of the circuit module as a program function for each processing functionality; and generating a behavior model description of a circuit that defines in-circuit behavior and state transition of input/output signals at clock cycle accuracy by incorporating the content of the program functions defined with the functional description into the state transition of the input/output signals defined with the interface description.

Furthermore, the present invention preferably provides a logic verification apparatus with a means for automatically generating a behavior model description that defines in-circuit behavior of the logic circuit and state transition of input/output signals at clock cycle accuracy, based on an interface description that defines the state transition of a group of input/output signals of the logic circuit and a functional description that defines the processing function of signals or data of a logic circuit regardless of clock operation.

When the means for generating the behavior model description generates a behavior model description of a logic circuit under verification, the behavior model description is a computation model for expected values of the logic circuit under verification. Therefore, it may be possible to verify the behavior of a hardware logic circuit realized according to the logic design data, based on the behavior model description and the logic design data (expected values) of the logic circuit that has been previously prepared.

The means for generating a behavior model description may also generate a behavior model description of a peripheral circuit. Therefore, the first behavior model description is preferably generated from an interface description and a functional description of the logic circuit under verification, and the second behavior model description is generated from an interface description and a functional description of a peripheral circuit connected to the logic circuit. Thereby, it may be possible to verify the circuit behavior realized according to the logic design data, based on the automatically generated first and second behavior models and the logic design data of the logic circuit that has been previously prepared.

Furthermore, the invention preferably provides, in at least one presently preferred embodiment, a computer-readable recording medium including software for generating a behavior model of a circuit which comprises the steps of:

(1) reading an interface description that defines the state transition of a group of input/output signals of a circuit module at clock cycle accuracy from an external file;
(2) converting the correlative relation between the input/output signal combination and the state name for each clock cycle defined in the interface description;
(3) generating a function name including a plurality of internal variables based on the input/output signal definition in the interface description;
(4) generating a deterministic finite state machine formed by modeling the state transition of the circuit module based on the state transition definition of input/output signal in the interface description; and
(5) converting the behavior of the deterministic finite state machine to a program function according to a predetermined rule, by selectively referring to the functional description file that defines the processing function of the signal or data of the circuit module.

Other potential features and advantages of various embodiments of the present invention will be apparent from the following description taken in conjunction with the accompanying drawings and attached claims.

BRIEF DESCRIPTION OF THE DRAWINGS

For the present invention to be clearly understood and readily practiced, the present invention will be described in conjunction with the following figures, wherein like reference characters designate the same or similar elements, which figures are incorporated into and constitute a part of the specification, wherein.

DETAILED DESCRIPTION OF THE INVENTION

It is to be understood that the figures and descriptions of the present invention have been simplified to illustrate elements that are relevant for a clear understanding of the present invention, while eliminating, for purposes of clarity, other elements that may be well known. Those of ordinary skill in the art will recognize that other elements are desirable and/or required in order to implement the present invention. However, because such elements are well known in the art, and because they do not facilitate a better understanding of the present invention, a discussion of such elements is not provided herein. The detailed description will be provided hereinbelow with reference to the attached drawings.

Figure 1:
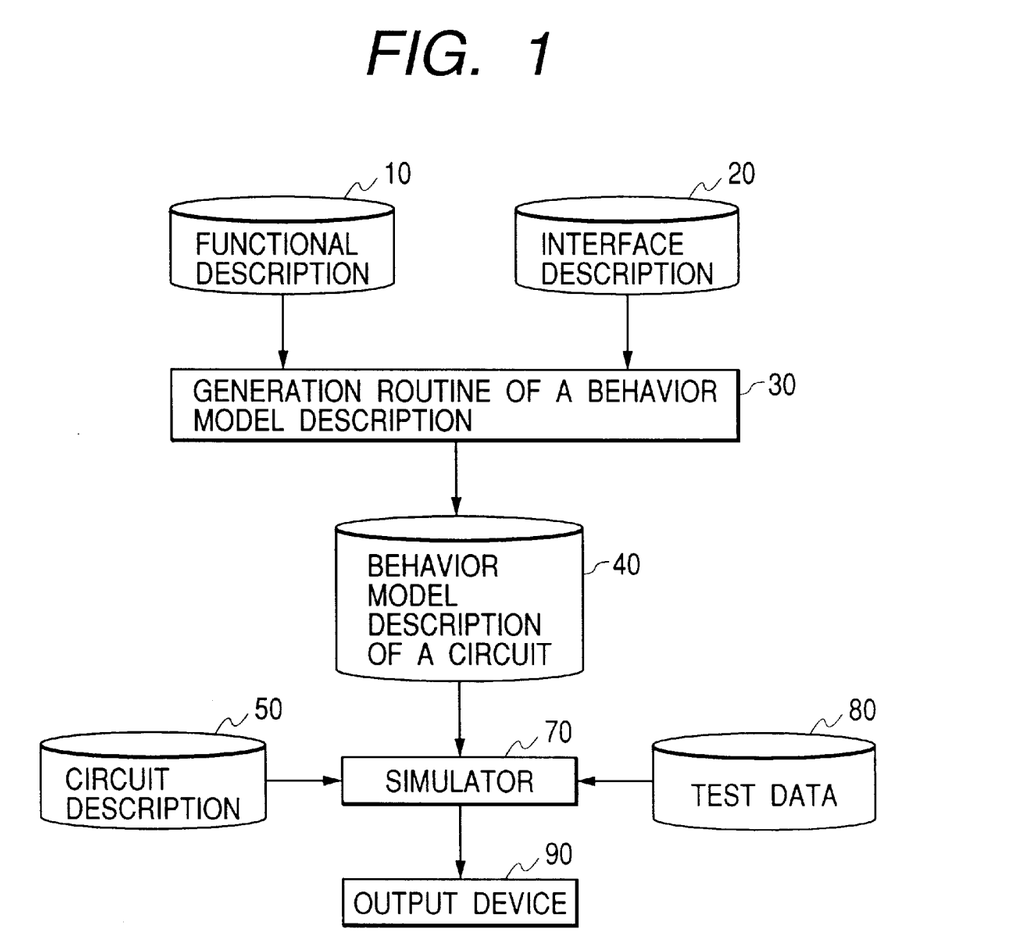
FIG. 1 illustrates the basic structure of a logic verification apparatus in accordance with the present invention.

FIG. 1 shows a basic structure of a logic verification apparatus in accordance with at least one preferred embodiment of the present invention. In FIG. 1, 30 denotes a generation routine of a behavior model description of a circuit for generating a behavior model description of a circuit 40 of a circuit module with the use of a functional description 10 and an interface description 20 of one circuit module (logic circuit) as the input. FIG. 1 also shows a simulator 70 for executing simulation operation based on the behavior model description of the circuit 40, a circuit description 50, and the test data 80 of the circuit module under verification. The simulator 70 may also supply the execution result to an output device 90.

Figure 2:
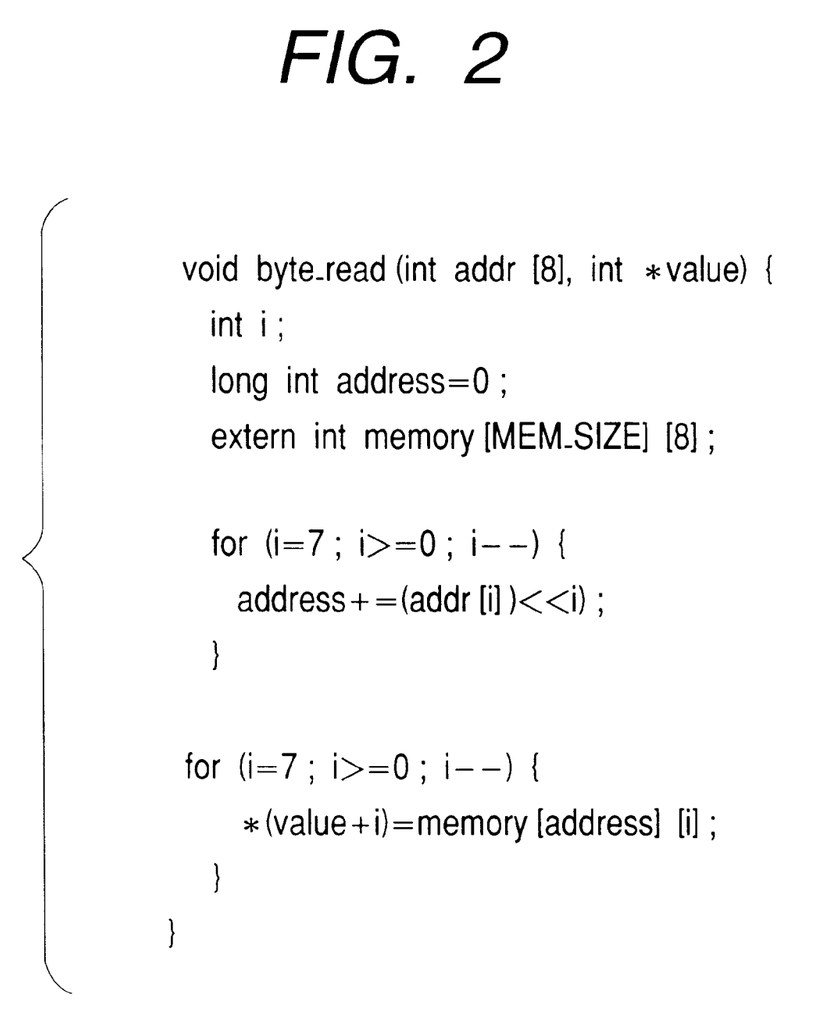
FIG. 2 illustrates one example of a functional description.

The functional description 10 is the functional description data that shows the function of one circuit module, for example, which is stored in a storage device such as a hard disk device, and the input/output signal timing information is preferably not included in the functional description 10. The functional description 10 is described by means of, for example, a software programming language such as C or C++ or a hardware description language such as VHDL or Verilog-HDL.

Where one circuit module has a plurality of functions, for example, the functional description 10 is described as a plurality of program functions having function names corresponding to the functions as shown in FIG. 2. The generation routine of the behavior model description of the circuit 30 calls out a functional description of a specified function based on the specified program function name.

FIG. 2 shows the functional description part having the function name "byte_read" as one example of the functional description 10. This functional description is a description of the read function of the data in a memory having an address line with 8 bits width and a word line of 8 bits width described by means of C language. The description represents a function in which the memory content in the read address that is specified with the first argument (int addr [8]) is transferred successively to the write address specified with the second argument (int *value).

The interface description 20 shows an external interface of the circuit module that is described by the functional description 10, and includes the timing information of the input/output signal that may be necessary when each function of the circuit module is used.

Figure 3:
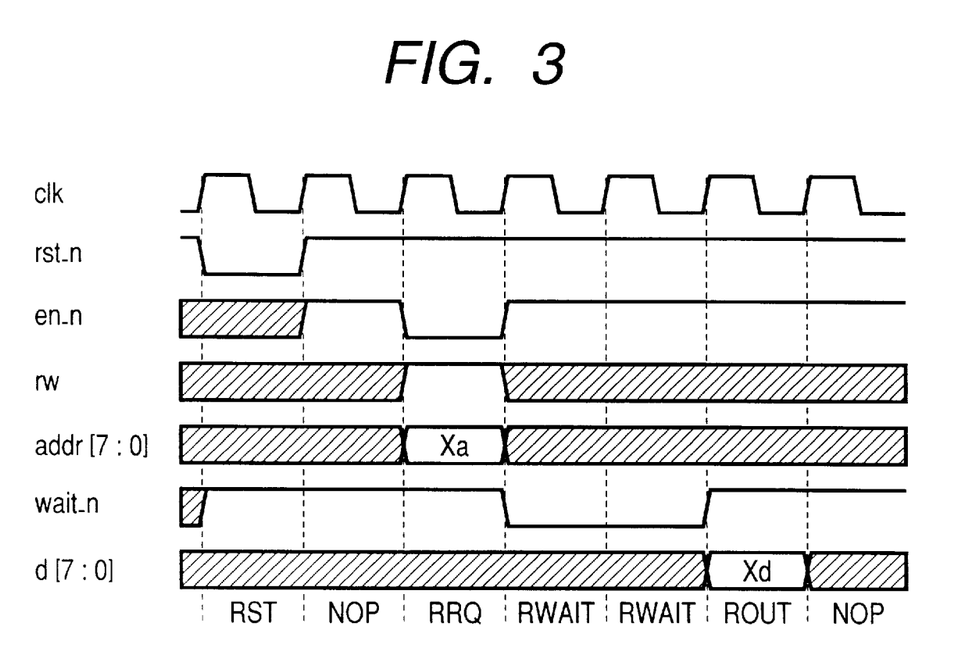
FIG. 3 illustrates one example of an input/output signal waveform in an interface of a circuit module.

FIG. 3 shows a timing diagram of various input/output signals when the data is read out in the simple memory as one example of the interface in the circuit module. Furthermore, FIG. 4 shows one example of an interface description corresponding to the signal waveform that is described by means of the OwL interface description methodology.

In FIG. 3, clk, rst_n, en_n, rw, addr, wait_n, and d denote a clock signal, reset signal, enable signal, read/write signal, address, wait signal, and data respectively, and RST (reset), NOP (no operation), RRQ (read request), RWAIT (read wait), and ROUT (read output) represent state names (alphabet names) given to respective state combinations of the signals in each clock cycle.

Figure 4:
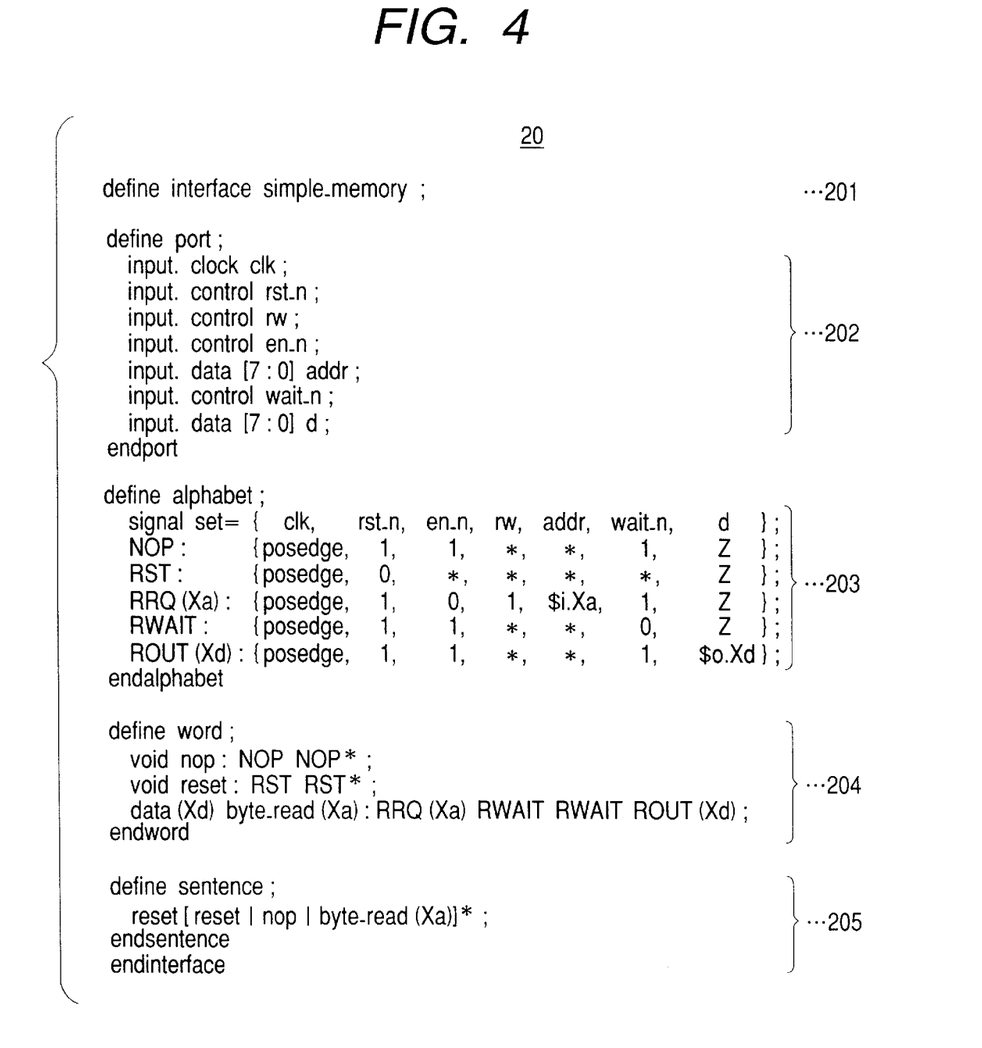
FIG. 4 illustrates one example of an interface description.

In the OwL interface description methodology, the interface that represents the signal change shown in FIG. 3 is defined in the description format having, for example, an interface declaration part 201, pin definition 202, value definition 203, function definition 204, and integrated information definition 205 as shown in FIG. 4.

In the interface declaration part 201, the module (interface) name "simple_memory" is declared, and in the pin definition 202, various signals handled by the interface of the circuit module (memory in this example) is defined in a form to which the input/output attribute (input/output/ input-output) and signal type attribute (clock/control/data) are added.

The value definition 203 defines the relationship between the signal value combination of the signal group and the state names (alphabet names). The name of a signal group is defined in parentheses "( )" in the first line, and in the following lines the state of a signal value of a signal group is defined in parentheses. Herein, the signal value "posedge" means the rising of a signal from the state "0" to the state "1" and is used only for signals having the clock attribute in the pin definition (define port part) 202 as a rule. Furthermore, "*" means "don't care" value, "Z" means the high impedance state, "$i.Xa" means a determination of the address addr, and "$o.Xd" means a determination of the output data d.

The function definition 204 defines the function of the circuit module based on the signal state transition (combination of state names) that may occur in the interfaces. Herein, the mark "*" means that the signal state indicated by the state name positioned just before the mark "*" is repeated in a range from 0 times to an infinite number of times.

According to the example shown in FIG. 4, the circuit module has "NOP" state repeating function (function definition name is nop), "RST" state repeating function (function definition name is reset), and read function (function definition name is byte_read (Xa)) for reading the data Xd arising from the state transition "RRQ, RWAIT, RWAIT, ROUT."

The integrated information definition 205 integrally describes the activation order (state transition) of the function defined by the function definition 204 in the circuit module with "|" shown in brackets "[ ]" corresponding to an OR symbol. In the case of the example shown in FIG. 4, any one state of reset, nop, and byte_read (Xa) occurs after the reset state because a "*" mark is added after the brackets, and any one of the states may occur repeatedly.

In the example, the interface description of the memory having nop, reset, and byte_read (Xa) functions is described as an example. However, in a case where the memory also has a data write function (function definition name is byte_ write (Xa)), if there is a characteristic signal value combination in the data write function: the state name (alphabet name) that indicates the signal value combination is added in the value definition; the description that indicates the relation between byte write (Xa) and the signal state transition is added in the function definition 204; and the description format of the integrated information definition 205 is changed to a description format that includes byte_ write (Xa) in the brackets "[ ]". In this case, the functional description 10 includes the function description having the function name corresponding to the type_write (Xa).

Figure 5:
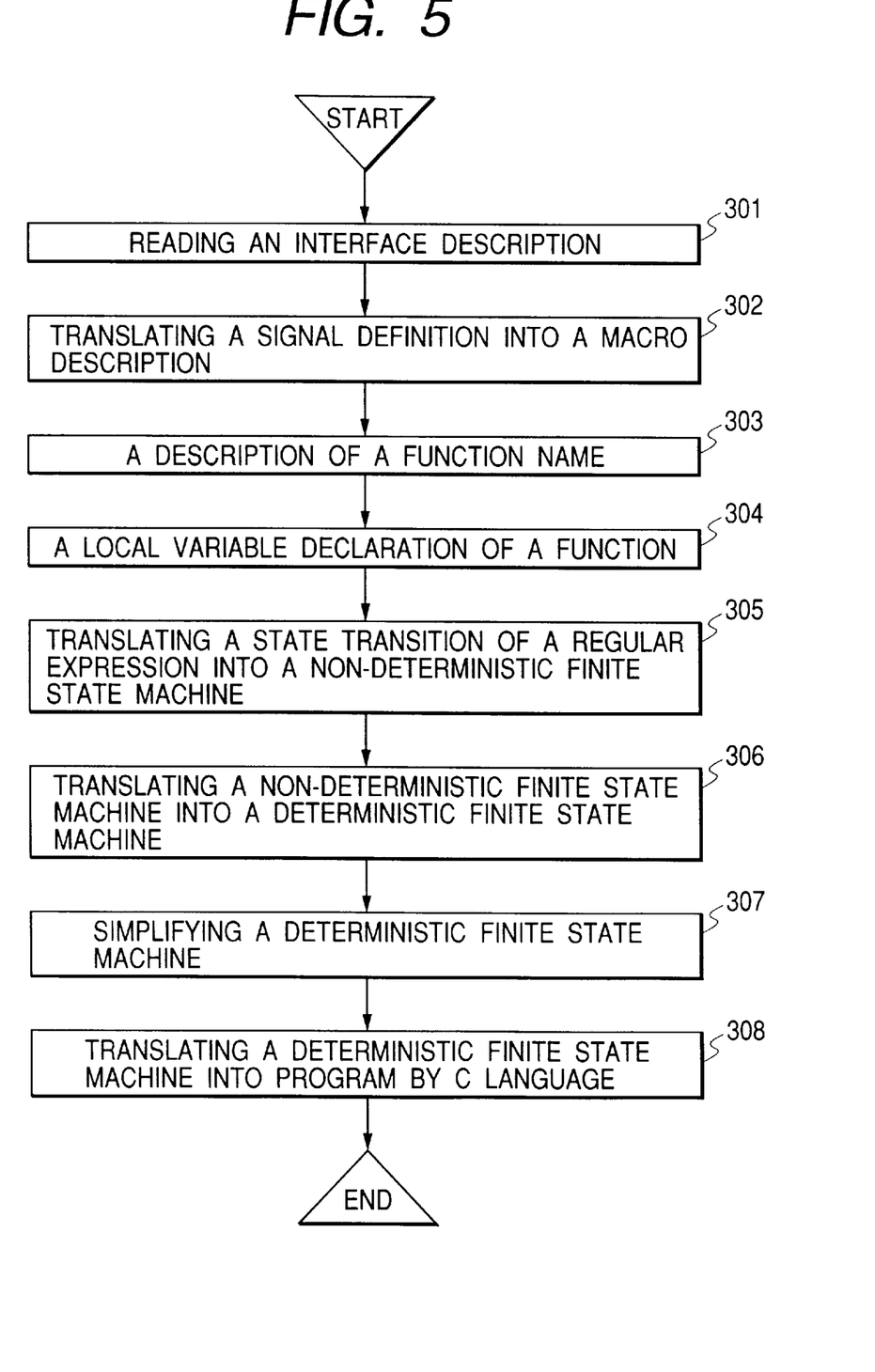
FIG. 5 is a flowchart describing the function of a generation routine of a behavior model description of a circuit.
Figure 6:
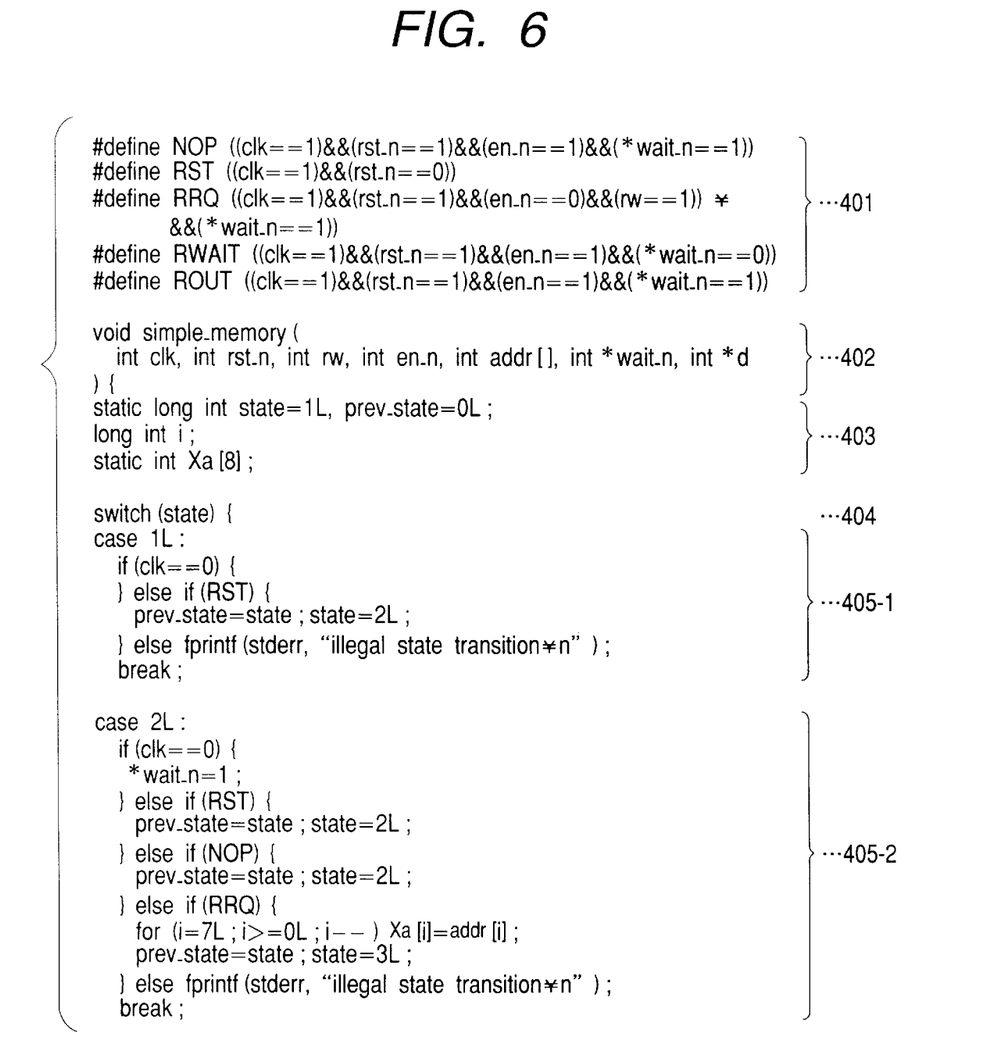
FIG. 6 illustrates part of a behavior model description of a circuit generated by way of the generation routine of the behavior model description of the circuit.
Figure 7:
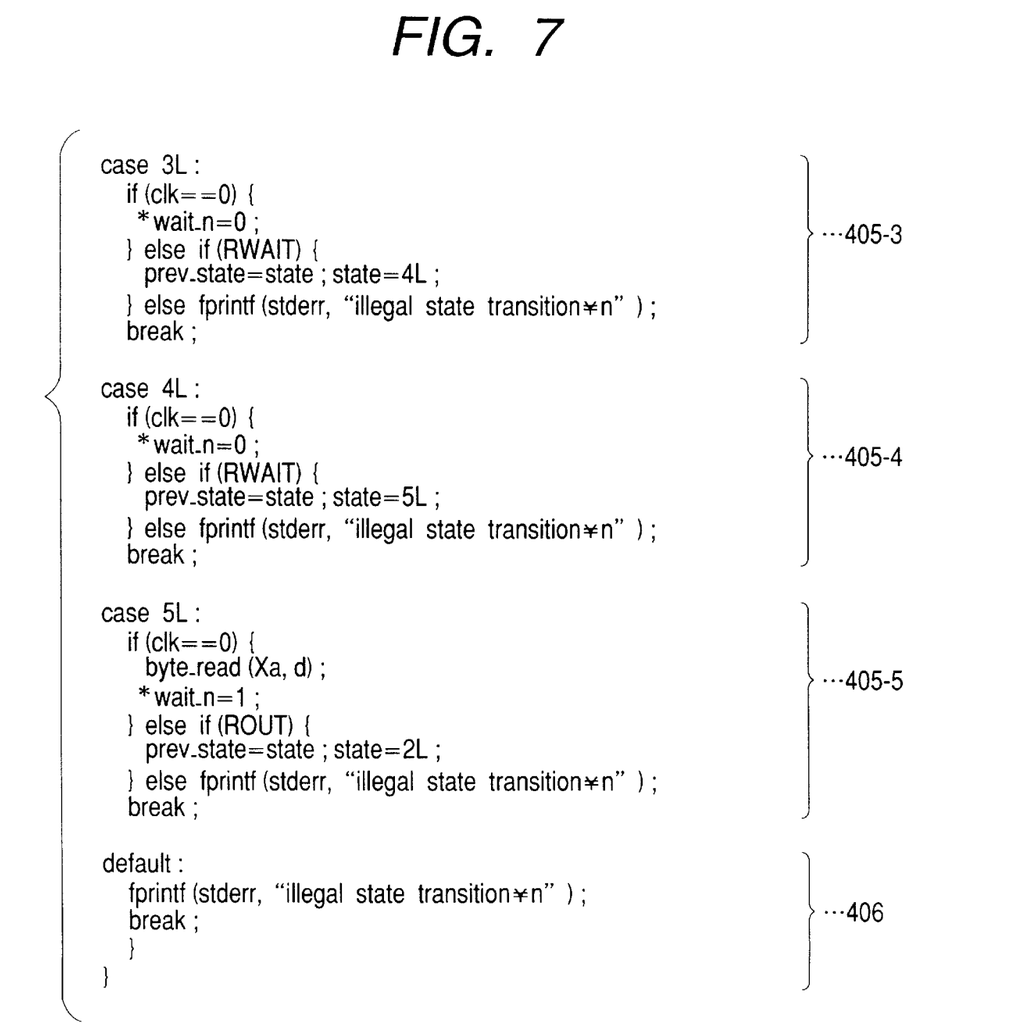
FIG. 7 illustrates the remaining part of the behavior model description of the circuit shown in FIG. 6.

FIG. 5 is a flowchart detailing one example of a generation routine of a behavior model description of a circuit 30, and FIGS. 6 and 7 show examples of a behavior model description of a circuit 40 generated by way of the routine.

In the generation routine of the behavior model description of the circuit 30, initially the interface description 20 exemplified in FIG. 4 is read (step 301). Next, each signal value described in the value definition (define alphabet part) is converted to the macro description with the macro name of each state name (alphabet name) (step 302).

For example, in the value definition 203 shown FIG. 4, the state name of NOP represents the following signal value combination as shown in parentheses "( )".

clk=posedge, rst_n=1, en_n=1, rw=*, addr=*, wait_n= 1, d=Z

The signal value combination is preferably converted to C language macro as shown hereinunder.

define NOP ((clk==1) && (rst_n==1) && (en_n)==1)
&& (*wait_n==1))

The signal value posedge indicates the rising from "0" to "1" in the value definition 203 of the interface description 20, but "1" indicates the signal value after the change is described in the macro. Furthermore, in the macro, signals having the signal value of "*" and/or "Z" are omitted, and a "*" mark is added to the signal having the input/output attribute of "output" or "inout" of the pin definition (define port part) before the signal name, for example, as "*wait_n".

The macro substitution is repeated for all of the state names (alphabet names) of the value definition 203 shown in FIG. 4 to thereby generate a signal definition 401 in the behavior model description of the circuit 40 as shown in FIG. 6.

Next, a description of a function name having a type void of a return value is generated with the function name of the module name in the interface declaration part 201 of the interface description 201 and with the argument of the signal described in the pin definition 202 (step 303). For example, seven signals, namely clk, rst_n, rw, en_n, addr, wait_n, and d, are described in the example shown in FIG. 4: the signal having the input/output attribute of input and having no width is named as int type; the signal having the input/output attribute of output or inout is named as int* type; and the signal having the input/output attribute of input and having a width (herein, addr) is named as int [ ] type. Thereby, a description of a function name 402 in the behavior model of the circuit 40 is generated as shown in FIG. 6.

Next, a local variable of a function is declared (step 304). Herein, initially the state variable state and the previous state variable prev_state are declared in the form of static long int type, and "1" and "0" are given as the initial values respectively. Next, an intermediate variable "i" is declared in the form of long int type, and, if there is an argument with input direction j in the value definition 203, then an int type arrangement having the same width as the bit width of the signal corresponding to this argument is preferably declared. In the case of the value definition 203 shown in FIG. 4, because the argument Xa of the state name RRQ comes under an argument with input direction, the variable Xa [8] having the same width as the width (8 bits) of the signal addr corresponding to this argument is declared in the form of int type arrangement. Thereby, as shown in FIG. 6, a local variable declaration of a function 403 in the behavior model description of the circuit 40 is generated.

Thereafter, a description that represents the state transition operation is generated. Because the state transition described in the integrated information definition (define sentence part) of the interface description 20 is described in the regular expression, at first the state transition is converted to a finite state machine (a non-deterministic finite state machine) that is equivalent to the state transition (step 305). For example, the description "reset [reset|nop|byte_read(Xa)]" shown in FIG. 4 is converted to a finite state machine to give the result shown in FIG. 8.

Figure 8:
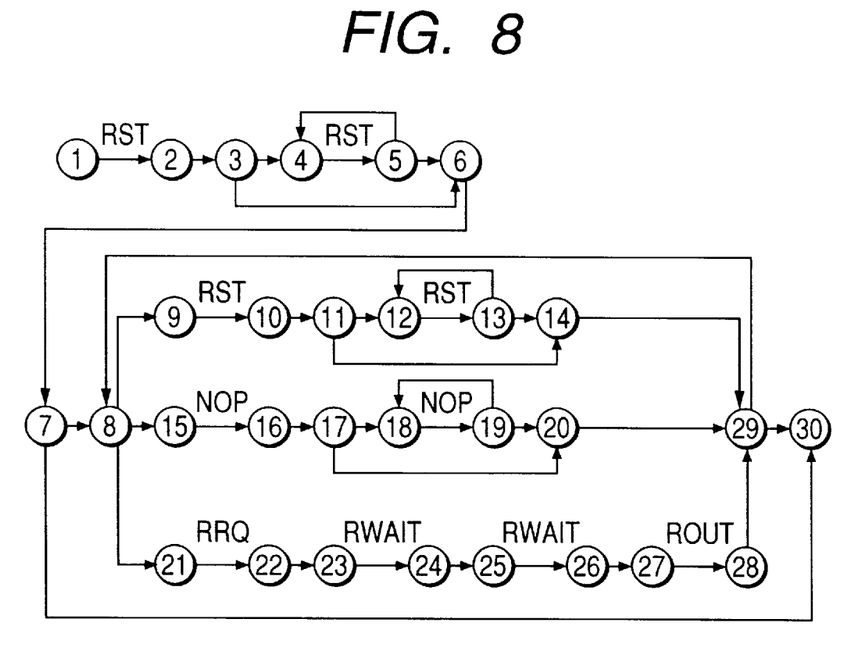
FIG. 8 illustrates one example of a non-deterministic finite state machine converted from a state transition described in an integrated information definition of an interface description.

Because the finite state machine is a non-deterministic finite state machine, in which a plurality of paths may exist for one input sequence, this finite state machine is preferably converted to a deterministic finite state machine for the purpose of simplification (step 307), and then converted to a C language program function (step 308).

Figure 9:
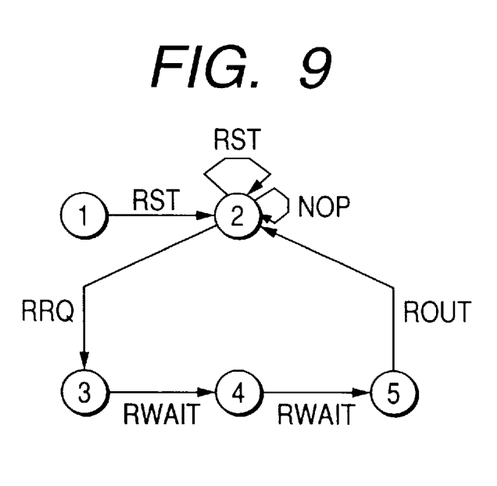
FIG. 9 illustrates a deterministic finite state machine converted from the non-deterministic finite state machine shown in FIG. 8.

The non-deterministic finite state machine shown in FIG. 8 is converted to a deterministic finite state machine for simplification to give a finite state machine shown in FIG. 9.

The algorithms for converting a regular expression to a non-deterministic finite state machine or converting a non-deterministic finite state machine to a deterministic finite state machine for simplification is described in, for example, Iwanami Shoten, publishers "Automaton. formal language theory and computation theory." However, the simplification of the finite state machine is not an indispensable process step in the generation of a behavior model description of a circuit 40 because it does not change the operation of a finite state machine itself.

The deterministic finite state machine shown in FIG. 9 is preferably converted to a C language program function, for example, as shown hereinunder in step 308.

At first, as shown in the description 404, a statement for declaration of a state switching switch(state)

is generated, and the number is assigned to each state of the state transition machine shown in FIG. 9. The number 1 is preferably assigned to the first state. This value corresponds to the initial value of the variable state declared in a local variable declaration of a function 403. Herein, "n" denotes the state number that is assigned to each state, and the following process is repeated for each state.

At first, "case nL:" is generated. For example, if the state number is 2, "case 2L:" is generated as shown in the first line of the description 405-2 shown in FIG. 6.

Next, the signal name clk of clock attribute in the pin definition 202 of the interface description 20 is cited to describe if (clk==0) {

In the "if" block, a value to be substituted to the output signal or inout signal in the transition from this state is described.

For example, in the finite state machine shown in FIG. 9, only RST is involved in transition from the initial state 1, and output signal wait n is "*" (don't care value) and inout signal d is "Z" (high impedance) in the state RST as shown in the value definition 203, therefore nothing is described.

However, in state 2 shown in FIG. 9, because a transition to any one of the next states RST, NOP, and RRQ, wait_n is 1,

*wait_n=1:

is described. However, because inout signal d is Z, which indicates high impedance, the description of it is not necessary.

Where it is necessary to change the output value depending on the previous state, the condition is changed depending on the prev_state that represents the previous state and the state that represents the current state. Furthermore, where there is an argument with output direction in the next transition, a corresponding function is called out from the functional description 10.

For example, according to the value definition 203 shown in FIG. 4, an argument with output direction "$o.Xd" is given to the signal d in the state ROUT. Furthermore, the state name ROUT is given to the function byte_read in the function definition 204. Thereafter, the function byte_read is called out from the functional description 10 in the state that the state ROUT is involved in the next transition (the state 5 in the example shown herein).

In the present example the same name is used for the function name defined by the functional description 10 and for the functional name used in the function definition of the interface description 20, however, different names may be used for functions to be called out as long as a corresponding relation between the function name and functional name is defined previously.

The "if" sentence is ended with "}". Where another transition occurs from this state, the algorithm continues with:

else if (TRANSITION) {

Herein, TRANSITION is the name of a transition and also the macro name. In this "if" sentence, the value of a state that represents the current state is substituted for the variable prev_state, and the value that represents the state after transition is substituted for the variable state. Where the transition involves the argument and input direction, it is required to receive the data.

In the example shown in FIG. 4, the state name RRQ included in the function byte_read corresponds to this case. Because RRQ has "$i.Xa" in the signal addr, it is required to take in a concrete value for Xa by use of the function byte_read of the functional description 10.

Therefore, because the signal addr has a width of 8 bits,
for (i=7L; i>=0L; i--) Xa[i]=addr[i]
is described by use of an intermediate variable i.

Where other transitions occur from the current state, the above process is repeated the number of times which corresponds to the number of transitions.

```
else fprintf(stderr, "illegal state transition
    \n");
    break;
```

The above process is repeated a number of times which corresponds to the number of states, to thereby generate the description 405-1 and 405-2 shown in FIG. 6 and the description 405-3 to 405-5 shown in FIG. 7. Finally, as shown in the description 406, the conversion is brought to an end with
default

```
default:
    fprintf(stderr, "illegal state\n");
    break;
    }
}.
```

By executing the above conversion processing, a behavior model description of a circuit 40 shown in FIGS. 6 and 7 is preferably obtained from the functional description 10 shown in FIG. 2 and the interface description 20 shown in FIG. 4.

A behavior model description of a circuit 40 has described by using the C programming language in this example, but other software programming languages such as C++ may be used for describing the behavior model description of the circuit 40. Furthermore, the interface has been described utilizing the OwL interface description language in the example, but other description languages may be used for the interface description 20 as long as the description language can be correlated to the functional description.

Figure 10:
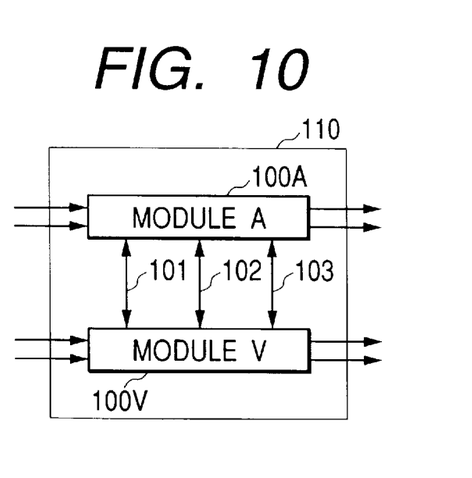

FIG. 10 shows an example of a logic circuit system 110 that is subjected to design verification by use of the generation routine of the behavior model description of the circuit 30. The system structure having two circuit modules, namely module A:100A and module V:100V, that operate utilizing handshaking with each other, will be described for the purpose of simplification below, but the present invention may be applied similarly to a logic circuit system having three or more circuit modules.

In the logic circuit system 110 shown in FIG. 10, the circuit module A is assumed to be an existing module, and the circuit module V is assumed to be a newly designed module (under design verification). It is assumed that the two circuit models communicate with each other through signals 101, 102, and 103 by way of a predetermined protocol (or data) and operate in linkage with each other. The existing circuit module A is assumed to be a peripheral circuit of the new circuit module V. In this case, a circuit behavior model of the peripheral circuit module A is required to verify the operation of the module V (validity of the design) by way of logic simulation. Furthermore, a computation model for expected values is required to verify the output of the module V.

Figure 11:
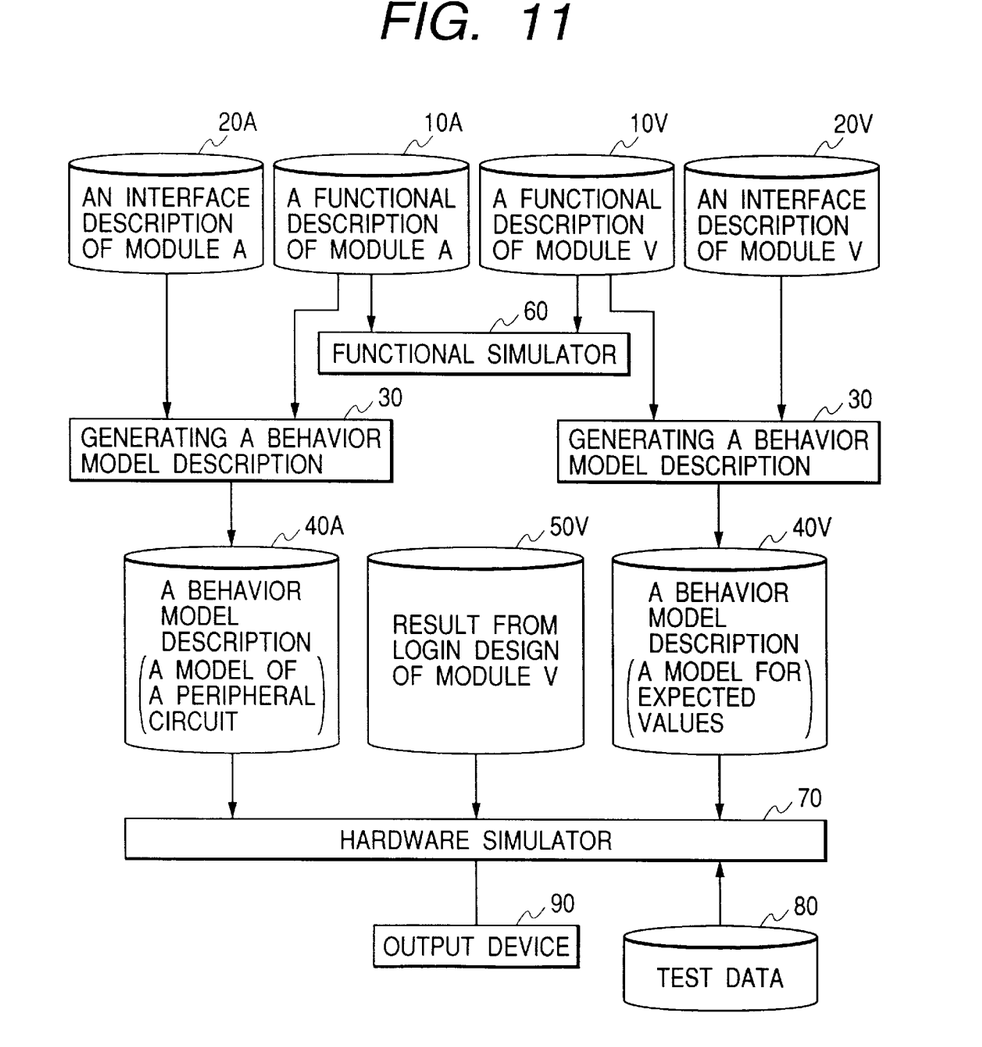
FIG. 11 illustrates one example of a logic verification apparatus in accordance with the present invention.

FIG. 11 shows the structure of a logic verification apparatus in accordance with the present invention that is preferably capable of verifying a logic circuit system 110 having a plurality of circuit modules.

In FIG. 11, 10A denotes a functional description of the module A, 20A denotes an interface description of the module A, 10V denotes a functional description of the module V, and 20V denotes an interface description of the module V. The components are preferably described by way of C language and the OwL interface description language, and are stored in a memory device such as a disk drive. Furthermore, 60 denotes a functional simulator for verifying the function of the entire logic circuit system 110, 70 denotes a hardware simulator for verifying the validity of result from logic design 50V of the module V, 80 denotes a test data file, and 90 denotes an output device. Herein, the functional simulator 60, generation routine of the behavior model description of the circuit 30, and hardware simulator 70 may be software stored in a memory medium and executed on a computer.

In the present invention, the generation routine of the behavior model description of the circuit 30 processes the functional description 10A of the module A and the interface description 20A of the module A to thereby generate a behavior model description of a circuit 40A of the module A. The generated behavior model description of the circuit 40A is supplied to the hardware simulator 70 as a model of a peripheral circuit with respect to the module V. Similarly, the routine of the behavior model description of the circuit 30 processes the functional description 10V of the module V and the interface description 20V of the module V to thereby generate a behavior model description of a circuit 40V of the module 40V. The generated behavior model description of the circuit 40V is supplied to the hardware simulator 70 as a computation model for expected values of the module V.

Figure 12:
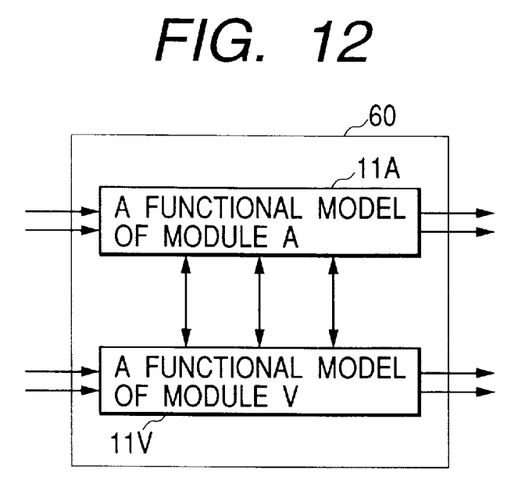
FIG. 12 is a diagram of a functional simulator shown in FIG. 11.

The functional simulator 60 links to a program library (not shown in the drawing) to thereby form an executable program comprising a module A functional model 11A that is formed by taking the functional description (program function) 10A of the module A in the simulator and a module V functional model 11V formed by taking the functional description (program function) 10V of the module V in the simulator as shown in FIG. 12, and verifies the whole function of the logic circuit system 110.

Figure 13:
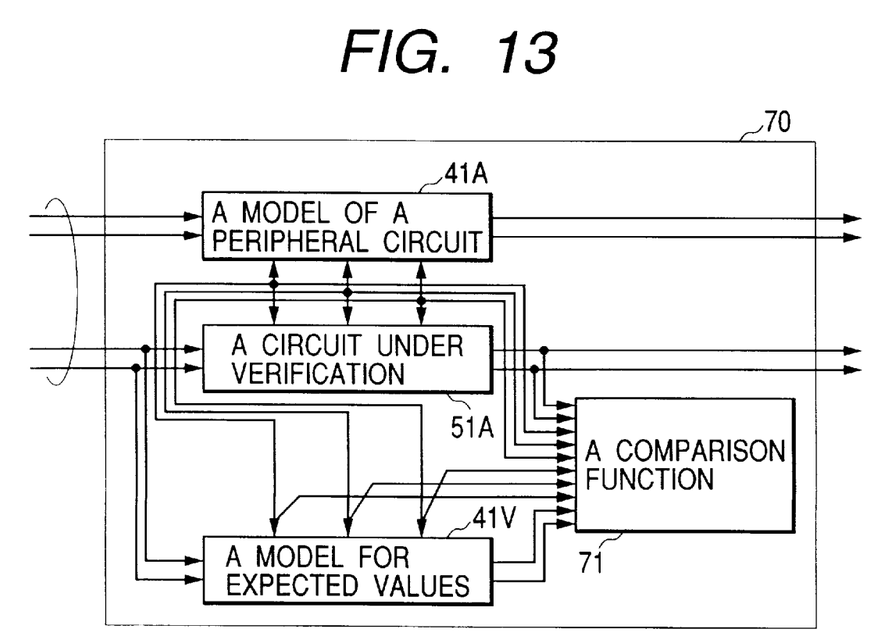
FIG. 13 is a diagram of a hardware simulator shown in FIG. 11.

The hardware simulator 70 combines a model of a peripheral circuit 41A formed by taking the behavior model of the circuit 40A of the module A in the simulator, a model for expected values 41V formed by taking the behavior model of the circuit 40V of the module V in the simulator, and a circuit under verification 51A formed by taking the result from logic design of the module V in the simulator as shown in FIG. 13, and verifies the output of these models and circuits by means of a comparison function 71.

The comparison function 71 monitors the input/output signal (signal having output or inout attribute) of the circuit under verification 51A and the computation model for expected values 41V corresponding with each other, determines whether these input/output values are identical or not, and supplies the determination result to an output device. Otherwise, the comparison function 71 may be provided as a part of the function of the computation model for expected values 41V.

As is obvious from the above examples according to the present invention, a highly accurate behavior model formed by defining the in-circuit behavior and the state transition of input/output signal at the clock cycle accuracy from the interface description and functional description of the circuit module may be produced. With at least some embodiments of the present invention, it may be possible to reduce the man-months of time required in the preprocessing stage before simulation of the circuit module.

Nothing in the above description is meant to limit the present invention to any specific materials, geometry, or orientation of elements. Many part/orientation substitutions are contemplated within the scope of the present invention and will be apparent to those skilled in the art. The embodiments described herein were presented by way of example only and should not be used to limit the scope of the invention.

Although the invention has been described in terms of particular embodiments in an application, one of ordinary skill in the art, in light of the teachings herein, can generate additional embodiments and modifications without departing from the spirit of, or exceeding the scope of, the claimed invention. Accordingly, it is understood that the drawings and the descriptions herein are proffered by way of example only to facilitate comprehension of the invention and should not be construed to limit the scope thereof.

What is claimed is:

1. A method for generating a behavior model of a circuit comprising the steps of;
   reading an interface description defining state transitions of a plurality of input/output signals of a circuit module at the clock cycle accuracy;
   reading a functional description defining processing functionality of said plurality of input/output signals of the circuit module, wherein each processing functionality is defined with a program function; and
   generating a behavior model description of said circuit, defining in-circuit behavior and state transition of said plurality of input/output signals at clock cycle accuracy, by combining the content of said program function defined with the functional description and the state transition of said plurality of input/output signals defined with the interface description.

2. The method for generating a behavior model of a circuit according to claim 1, wherein said interface description further comprises:
   a pin definition part defining a name and attributes for each of said plurality of input/output signals of the circuit module;
   a signal definition part defining a state name for a specified signal value combination of the plurality of input/output signals during each clock cycle,
   a function definition part associating a functional name with a specified combination of state names, and
   an integrated information definition part defining the state transitions of each of said plurality of input/output signals that occur in the circuit module with a combination of functional names defined by the function definition part, wherein each program function in the functional description has been previously correlated to one of said functional names defined with the function definition part.

3. The method for generating a behavior model of a circuit of claim 1, wherein said step of reading a functional description defining the processing functionality further includes reading a functional description defining the processing functionality of a plurality of data signals of the circuit module.

4. The method for generating a behavior model of a circuit of claim 1, wherein said functional description is written with software.

5. The method for generating a behavior model of a circuit of claim 1, wherein said step of generating a behavior model description of a circuit further comprises the steps of:
   generating a non-deterministic finite state machine of said defined state transitions of the plurality of input/output signals of the circuit;
   translating said non-deterministic finite state machine into a deterministic finite state machine;
   simplifying said deterministic finite state machine; and
   translating said deterministic finite state machine into a software program.

6. A logic verification apparatus, comprising:
   a means for automatically generating a behavior model description of a hardware circuit, defining in-circuit behavior and state transition of input/output signals at clock cycle accuracy, based on an interface description defining the state transition of said input/output signals of the hardware circuit under verification at clock cycle accuracy and a functional description defining the processing function of signals and data of the hardware circuit regardless of clock operation, and
   a means for verifying the behavior of the hardware circuit based on the behavior model description generated automatically and logic design data of the hardware circuit at clock cycle accuracy.

7. A logic verification apparatus, comprising:
   a means for automatically generating a first behavior model description defining the internal behavior of the hardware circuit and state transition of input/output signals from an interface description of the hardware circuit and a functional description thereof, and
   a means for automatically generating a second behavior model description defining the internal behavior of a peripheral circuit connected to the hardware circuit and state transition of input/output signal at clock cycle accuracy from an interface description of the peripheral circuit connected to the hardware circuit and a functional description thereof; and
   a means for verifying the behavior of the hardware circuit based on the first and second behavior model descriptions generated automatically and logic design data of the hardware circuit at clock cycle accuracy.

8. The logic verification apparatus according to claim 6, wherein said interface description of the circuit further comprises:
   a pin definition part defining a name and attributes of each input/output signal of the circuit;
   a signal definition part defining a state name for a specified signal value combination of the input/output signals of the circuit during each clock cycle;
   a function definition part associating a functional name with a specified combination of state names, and an integrated information definition part defining the state transition of input/output signals that occur in the circuit based on a combination of functional names defined in the function definition part, wherein the functional description defines the processing function of the signal and data of the circuit as a program function which has been previously correlated to at least one functional name defined in the function definition part, and wherein the means for generating a behavior model description combines the interface description and function description by use of the relation between the functional name and program function to generates the behavior model.

9. The logic verification apparatus according to claim 6, wherein said means for verifying the behavior of the hardware circuit is a simulator.

10. The logic verification apparatus of claim 6, further comprising:

a memory for storing test data values connected to said means for verifying.

11. The logic verification apparatus according to claim 6, wherein said logic design data of the hardware circuit is coded with software.

12. The logic verification apparatus according to claim 6, wherein said means for automatically generating a behavior model of a circuit is to:

generate a non-deterministic finite state machine of said defined state transitions of the input/output signals of the circuit;

translate said non-deterministic finite state machine into a deterministic finite state machine;

simplify said deterministic finite state machine; and translate said deterministic finite state machine in a software program.

13. A logic verification apparatus, comprising;

a first memory means for storing logic design data of a hardware circuit under verification;

a means for automatically generating a behavior model description defining the internal behavior of a peripheral circuit connected to said hardware circuit and state transition of input/output signals at clock cycle accuracy, based on an interface description defining the state transition of the input/output signals of the peripheral circuit connected to said hardware circuit, and a functional description defining a processing function of the input/output signals and data of the peripheral circuit regardless of the clock operation; and a second memory means for storing the generated behavior model description, wherein the behavior of the hardware circuit is verified at clock cycle accuracy based on the logic design data of the hardware circuit stored in the first memory means and the behavior model description of the peripheral circuit stored in the second memory means.

14. The logic verification apparatus according to claim 13, wherein the interface description further comprises:

a pin definition part defining a name and attributes for each of said input/output signals of the peripheral circuit, a signal definition part defining a state name for a specified signal value combination of the input/output signals of the peripheral circuit during each clock cycle, a function definition part associating a functional name with a specified combination of state names, and an integrated information definition part integrally defining the state transition of the input/output signals that occur in the peripheral circuit with a combination of functional names defined in the function definition part, wherein the functional description defines the processing functionality of the signals and data of the peripheral circuit as a program function which has been previously correlated to one of said functional names defined in the function definition part, and further wherein the means for automatically generating a behavior model description combines the interface description and function description by the use of the relation between the functional name and program function to generate the behavior model.

15. The logic verification apparatus according to claim 13, wherein said means for automatically generating a behavior model description are to:

generate a non-deterministic finite state machine of said defined state transitions of the input/output signals of the peripheral circuit;

translate said non-deterministic finite state machine into a finite state machine;

simplify said deterministic finite state machine; and translate said deterministic finite state machine into a software program.

16. The logic verification apparatus according to claim 13, further comprising:

a third memory means that holds test data.

17. The logic verification apparatus according to claim 13, further comprising:

an output device to output the generated behavior model description.

18. A computer-readable recording medium having software recorded thereon for generating a behavior model of a circuit, said software performing a process which comprises the steps of;

reading an interface description defining the state transitions of a group of input/output signals of a circuit module at clock cycle accuracy from an external file, converting the correlative relation between an input/output signal combination and a state name for each clock cycle defined in the interface description, generating a function name including a plurality of internal variables based on the input/output signal definition in the interface description, generating a deterministic finite state machine formed by modeling the state transition of the circuit module, based on the state transition definition of input/output signal in the interface description, and converting the behavior of the deterministic finite state machine to a program function according to a predetermined rule by selectively referring to the functional description file defining the processing function of the signal or data of the circuit module.

* * * * *